Feb. 3, 1970 W. C. ROSVOLD 3,493,820

AIRGAP ISOLATED SEMICONDUCTOR DEVICE

Filed Dec. 1, 1966 2 Sheets-Sheet 1

INVENTOR
WARREN C. ROSVOLD
BY [signature]
AGENT

Feb. 3, 1970 W. C. ROSVOLD 3,493,820

AIRGAP ISOLATED SEMICONDUCTOR DEVICE

Filed Dec. 1, 1966 2 Sheets-Sheet 2

INVENTOR
WARREN C. ROSVOLD
BY [signature]
AGENT

United States Patent Office 3,493,820
Patented Feb. 3, 1970

3,493,820
AIRGAP ISOLATED SEMICONDUCTOR DEVICE

Warren C. Rosvold, Sunnyvale, Calif., assignor to Raytheon Company, Lexington, Mass., a corporation of Delaware Filed Dec. 1, 1966, Ser. No. 598,477
Int. Cl. H01l 3/00, 5/00
U.S. Cl. 317—234 1 Claim

ABSTRACT OF THE DISCLOSURE

A dielectrically isolated semiconductor structure having a plurality of active areas contained within a support grid and dielectrically isolated from one another and from the grid by airgaps extending completely through the structure.

In conventional semiconductor devices which utilize a number of active areas, isolation is usually accomplished by surrounding the active areas with polycrystalline material, metal, or other selected material which must be insulated from the active areas by a suitable dielectric, or by supporting the active areas on one surface of a bulk supporting material such as polycrystalline silicon, metal, or the like which must be insulated from the active areas by an intermediate layer of dielectric material. In other semiconductor devices, isolation has been attempttd by providing what are termed "airgaps"; that is, the active areas are spaced apart by spaces containing air rather than bulk material. This has been attempted in devices which are known as "flip-chip" devices wherein the active areas are provided with electrodes having ohmic contacts thereon and are connected to additional circuit devices having printed circuit or similar circuitry with selected areas of the external circuit device, and bonding the contacts to the printed circuitry.

In the first above-described structures, many drawbacks exist such as the necessity for an intermediate dielectric insulating layer which requires the employment of several additional processing steps during fabrication of the device. Furthermore, such structures inherently possess undesirable capacity cooling between active areas and permit relatively low operating speed of the circuit.

Flip-chip devices as described above possess a further drawback in that they require blind mounting of the ohmic contacts in engagement with the printed circuitry because true "see-through" airgaps are not present and the bulk supporting layer obscures the areas of the printed circuitry to which the contacts on the active areas are to be bonded, both during and after the bonding process, thus tending to make relatively inaccurate the bonding procedure.

SUMMARY OF THE INVENTION

The present invention overcomes the above and other deficiencies of the prior art by the provision of flip-chip devices which have true air gap isolation for the active areas thereof, the presently described true air gap isolation extending completely through the device and providing see-through capabilities which allow accurate positioning of a multi-leaded structure on a bonding substrate. With devices of this type, the active areas are disposed with their electrode surfaces in a common ground plane with the surface of the supporting grid thus reducing capacitive cooling between active areas and increasing the operating speed of the circuit. This approach to multiple component device manufacture thus permits the exact alignment of a plurality of leadouts on a bonding substrate by techniques wherein all contacts may be bonded simultaneously by ultrasonic techniques in contrast to prior art devices which are wasteful of supporting wafer or bulk material area and must have each lead individually bonded.

In the present description, "active areas" or units each comprise an island or mesa which is to be subsequently provided with two or three electrodes for the formation of diodes, transistors, resistors, or the like, as will be described.

Other objectives and advantages of this invention will become apparent from the following description taken in connection with the accompanying drawings.

DESCRIPTION OF THE PREFERRED EMBODIMENT

Figure 1:
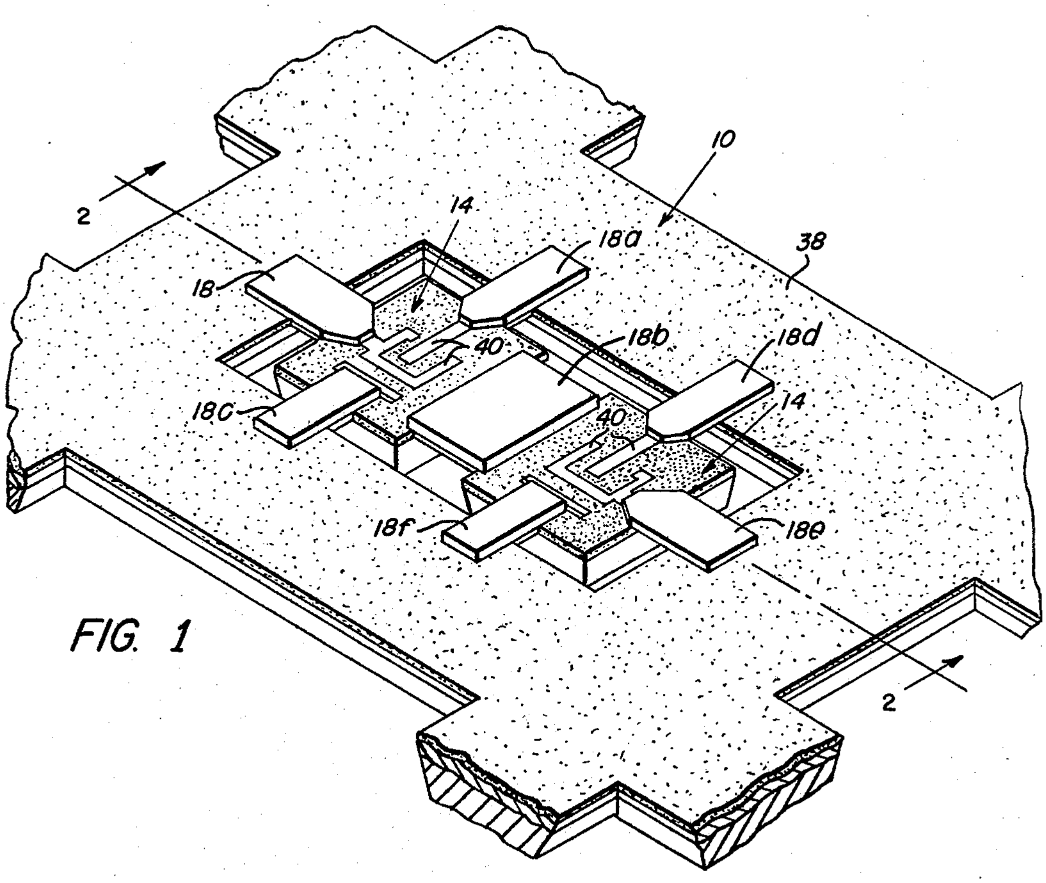
FIG. 1 is a perspective elevational view of a semiconductor device embodying a preferred form of the invention.

FIG. 1 shows a flip-chip device embodying the prestnt invention, and more specifically shows a portion of a device wherein a grid 10 is provided with an opening 12 therethrough in which opening are disposed two active areas 14. It is to be noted that airgaps or spaces exist between the active areas 14 and between the active areas and the support grid 10, which airgaps extend completely through the device. The active areas 14 are supported by surfaces of the grid through utilization of metal contacts or leadouts 18*a*–18*f*, the contacts being the sole means for attaching the active areas to the supporting grid other than thin areas of oxide beneath the contacts in the areas of the airgaps.

In the manufacture of a circuit device of the type shown in FIG. 1, there is first provided a single crystal silicon chip or wafer which preferably has a resistivity of about .01 ohm cm. and less than about 2000 dislocations per square centimeter. The crystal ingot from which the wafer is grown is sliced in the [100] plane and a flat is ground in the [100] plane. The flat is used for alignment in the proper crystallographic orientation which is necessary for the etch process, to be hereinafter described. The wafer is processtd by conventional lapping, polishing and etching processes to a desired resultant size, such as about six mils thick and one inch in diameter, for example.

Figure 2:
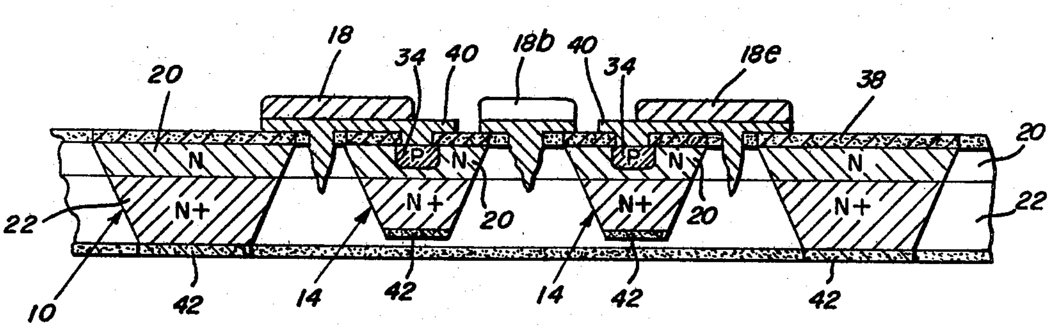
FIG. 2 is an enlarged sectional view taken substantially along the line 2—2 of FIG. 1 looking in the direction of the arrows.

The single crystal wafer or chip is suitably doped in any well-known manner to provide it with the selected N or P type conductivity characteristics and of such concentration of dopant as will provide the desired resistivity of about .005–.015 ohm cm., whereby the conductivity may be termed as N+ or P+. This wafer will eventually become the N+ portions 16 of the active areas 14 in FIG. 2.

The upper surface of the wafer is then covered with a single crystal N type layer 20. This may be done by conventional well-known epitaxial deposition which may be briefly described as reacting a silicon compound such as silicon tetrachloride, silane, or tetraorthosilicate with a reducing cempound, such as hydrogen, for example, in vapor form onto the N+ wafer surface 16 in a furnace for about 8–15 minutes to produce a thickness of about 14–16 microns. Layer 18 is doped with arsenic, antimony, phosphorus, or other N type dopant in an amount sufficient to provide it with a resistivity of about 3–5 ohms cm., for example. However, other thicknesses and amounts of doping may be employed to provide a desired resistivity in accordance with the device requirements.

It is to be understood, of course, that in the event that the wafer is a P type material, the epitaxial layer 20 will be doped with boron to provide it with P type conductivity characteristics, as is well known.

Figure 3:
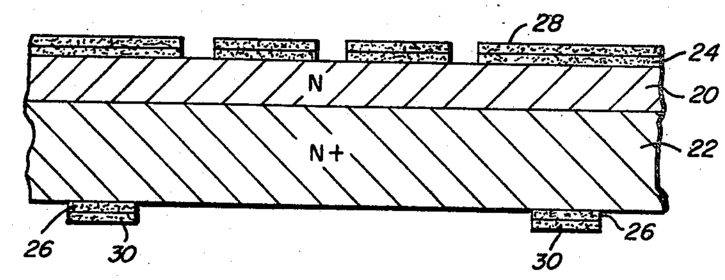
FIGS. 3–7 are enlarged fragmentary sectional views similiar to FIG. 2 illustrating various steps in the fabrication of a device such as illustrated in FIG. 1.

At this point the epitaxially coated wafer, indicated by numeral 22 in FIG. 3, is made thin in the areas where active units or active areas 14 are to be provided. This is done by an etching process which involves first oxidizing both front and back surfaces of the wafer to provide the surfaces with layers 24 and 26 of silicon dioxide. Oxidation may be accomplished by any of the known thermal growing or other oxidation techniques to form the silicon dioxide film to a thickness of two to four (preferably three) microns. To confine the silicon dioxide to only those surface areas which are not to be etched, suitable masking is done to permit removal of silicon dioxide where desired.

Both oxidized surfaces of the wafer are coated with a photoresist material such as the solution known as KPR, sold under that terminology by Eastman Kodak Co., for example.

The particular masking technique used here is not in itself unique insofar as this invention is concerned, and, therefore, will be only briefly described herein. A photographic film is prepared with the desired pattern thereon, and the wafer is provided with layers 28 and 30 of photoresist material, such as KPR, which overlies the silicon dioxide layers 24 and 26 respectively. Coatings 28 and 30 are exposed through the film to ultraviolet or other radiation to which they are sensitive, and developing then takes place by dipping the wafer in a solution such as trichloroethylene to remove unsensitized KPR. The wafer is then baked at about 150° C. for about 10 minutes, whereupon the oxide supports thereon a resultant hardened photoresist mask having the desired configuration or pattern.

The silicon dioxide is then removed in the exposed window areas of the photoresist pattern. This is done by placing the wafer in a solution containing about one part of hydrofluoric acid (HF) and nine parts of ammonium fluoride ($NH_4F$) to etch away the exposed areas of silicon dioxide, following which it is rinsed in water and dried. The remaining photoresist may now be removed if desired by a solution of one part sulphuric acid and nine parts of nitric acid at about 100° C. for about ten minutes. However, the photoresist may be left on if desired because it will be automatically removed in the following etching process.

To etch the exposed surfaces of the wafer, the wafer is placed in a suitable rack, and heated in boiling water to preheat it to the temperature of the etching solution, that is, about 115° C. The etching solution is a saturated solution, i.e., at least 25% of sodium hydroxide (NaOH) in water, preferably in an amount of 33%. The preheated wafer is subjected to the etchant for the time necessary to etch the back surface of layer 16 to remove material down to a depth suitable to establish the desired thickness of the active areas 14. This depth may be about 30 microns. This etching takes place from the [100] plane surface along the [100] planes of the single crystal material.

Figure 4:
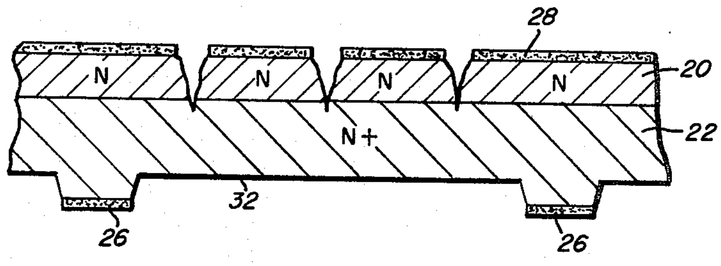
Figure 5:
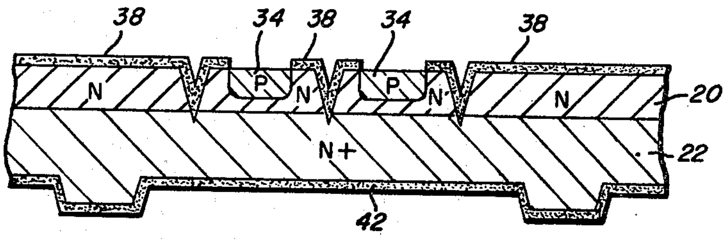

At the same time that the back surface of the wafer 22 is being etched, the epitaxial layer 20 is also being etched in selected areas between the respective active areas 14 as well as between the active areas 14 and the portions of the device which are to become the supporting grid 10. For this purpose, the epitaxial layer 20 is also oxidized and masked as shown in FIG. 3. Such etching of the epitaxial layer 20 extends slightly through the interface between layers 20 and 22 as indicated by numeral 36. At this stage, the device appears substantially as shown in FIG. 4 wherein the N+ single crystal material will have cavities or depressions 32 in the areas where the active units 14 will eventually be formed.

It is desirable at this time to form the electrodes of the device. This is done by again oxidizing the entire device and thereafter masking as described above to provide windows in newly grown oxide layer 38 through which the epitaxial layer 20 is exposed. This exposure of the epitaxial layer 20 will occur only where electrodes are to be diffused therein. This diffusion of electrodes is done in the well-known manner through windows in the oxide and briefly may comprise diffusing boron or other P type dopant from a gas phase in a furnace at about 1100° C. for about 15 minutes, then subjecting the device to dry oxygen at a temperature of about 1100° C. for about 25 minutes to drive the boron into the epitaxial layer 20 to a depth of about 2–3 microns, for example.

This provides in the device regions having diode characteristics since the epitaxial layer 20 itself may be utilized as one electrode and a diffused P region 34 as the second electrode. In the event that three-electrode devices are to be made, an emitter electrode (not shown) of N type may be diffused into each P region 34.

At this stage, the front or upper surface of the device is provided with metallized areas 40 for connection of the electrodes to metal contacts or "leadouts" which are to be applied. It is desired that in order to effectively plate the leadouts on the metallized areas that equipotential electric contact be made through the low resistivity N+ subttrate 22. Therefore, the oxide is removed from within the depressions 36 which were etched through the epitaxial layer 20 into the substrate, and the metallized areas 40 are made to extend through the depressions into contact with substrate 22. The metallizations may be aluminum, chrome-gold, titanium, platinum, or other selected conductive material which may be readily bonded to the semiconductor material and which can be readily plated in the formation of the metal contacts or leadouts. Such metallized areas can be made by vaporization techniques well known in the art, or by any other desired technique.

Figures 6, 7:
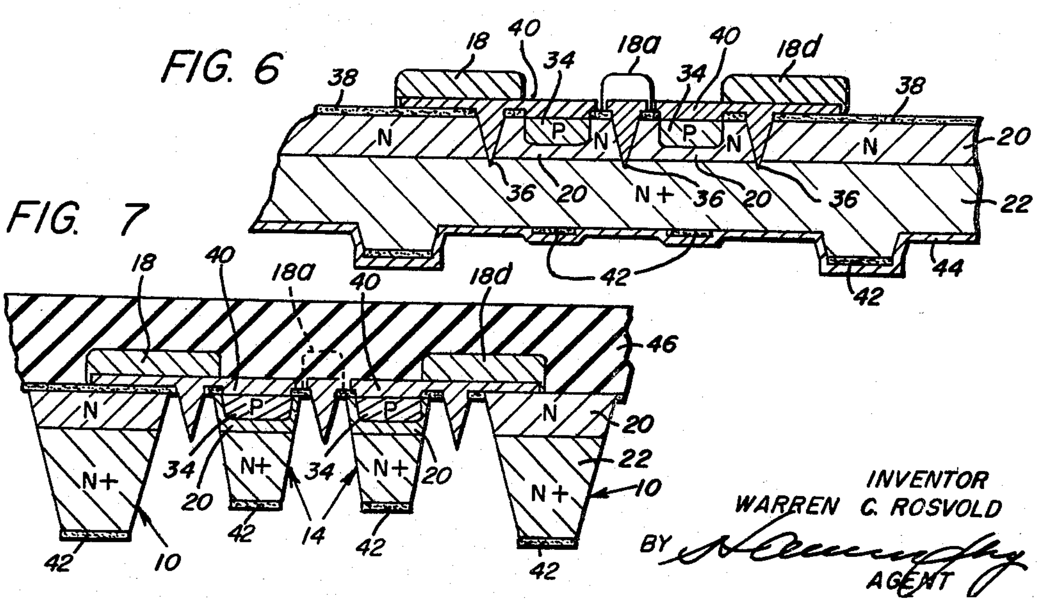

Before forming the leadouts, an isolation mask pattern is provided. This is done by the photoresist method described hereinbefore to remove selected areas of the oxide layer 42 on the back of the substrate as shown in FIG. 6. Then aluminum or other suitable conductive metal is deposited as a layer 44 over the mask and over the remainder of the rear surface of the substrate. Aluminum layer 44 is used as a contact in order to eventually plate the leadouts or support leads 18–18*e*. Then the front surface of the device is masked and open areas are provided over the metallizations 40 within which the leadouts are to be located. Then, after attaching a lead to the metal contact layer 44 and masking the remainder of layer 44 with wax or the like to prevent plating thereon, bulk metal such as gold or copper is deposited on the exposed metallized areas 40 to form the leadouts or support leads 18–18*e* as shown in FIGS. 1 and 6.

The device is at this point mounted by its front surface in silicone rubber 46 with its back surface exposed and isolation of the active areas 14 is achieved by using the crystal oriented etch technique described hereinbefore. By this means the N+ substrate 22 and the N type epitaxial layer 20 are etched completely through from the aluminum contact layer 44 down to the oxide layer 38.

When this etching step is taking place the sides of the active areas 14 are being shaped as desired. The etching occurs from the [100] plane surface through the semiconductor material along the [111] planes which are at an angle of about 54.7° with the [100] surface plane.

This completely isolates the active areas 14 from one another and from the surrounding support grid 10 so that an airgap completely encircles the peripheries of each of the active areas. The silicone rubber 46 prevents complete airgap penetration of the device and, therefore, is removed by use of an organic solvent, such as kylene, which does not attack any of the other portions of the device. Now complete "see-through" characteristics are provided since nothing exists in the area of the air gaps which prevents a device fabricator from seeing through the air gaps to a circuit device to which the present device is to be bonded.

It will be apparent that the active areas 14 are supported only by the support leads 18–18*a* as shown in FIG. 1 and, of course, the thin layer of oxide which underlies each support lead where it spans an air gap.

From the foregoing description, a clear understanding of this invention may be had, together with the objectives and advantages thereof. However, it is to be understood that changes be made by those skilled in the art without departing from the spirit of the invention as expressed in the accompanying claims.

I claim:

1. A flip-chip type semiconductor device comprising a wafer of semiconductor material having a front and a rear surface and having a plurality of active semiconductor components, each component including at least two contiguous regions of opposite conductivity type semiconductor material, a first layer of insulating material covering the front surface of said wafer including the active components, a second layer of insulating material covering the rear surface of said wafer, each of said regions having a respective metal ohmic contact connected thereto through said first layer and extending up onto said first layer, an open channel extending from said rear surface entirely through said second insulating layer and said wafer dividing said wafer into two portions, the first of said portions comprising said components and being encircled completely by said channel, the second of said portions completely encircling said first portion and said channel, said second portion consisting of only one conductivity type semiconductor material free of any active components and free of any electrodes contacting said second portion, means for suspending and supporting said active components solely from said second portion, said means comprising and metal ohmic contacts, a further metal layer on each ohmic contact, and said insulating layer, said metal ohmic contacts and further metal layers extending from said active components parallel to said front surface across said channel onto said second portion, said first insulating layer extending across said channel but only beneath each of said metal ohmic contacts, said channel having an additional portion extending between said active components, means extending across the additional channel portion for further supporting the components, said last mentioned means comprising said first insulating layer and a metal support on said first insulating layer, said first insulating layer extending across the additional channel portion but only beneath the metal support, said metal support terminating on said components without making contact to the wafer, and the depth of the first portion from said front to said rear surface being less than the corresponding depth of the second portion.

References Cited

UNITED STATES PATENTS

| | | | |
|---|---|---|---|
| 3,313,013 | 4/1967 | Last | 317—235 X |
| 3,396,312 | 8/1968 | Cunningham et al. | 317—101 |
| 3,426,252 | 2/1969 | Lepselter | 317—234 |
| 3,335,338 | 8/1967 | Lepselter | 317—234 |

OTHER REFERENCES

IBM Technical Disclosure Bulletin (Schwartz), vol. 3, No. 12, May 1961, pp. 26–27.

JOHN W. HUCKERT, Primary Examiner

J. R. SHEWMAKER, Assistant Examiner

U.S. Cl. X.R.

29—580, 589; 156—17; 317—101